United States Patent [19]
Hasegawa et al.

[11] Patent Number: 5,208,425
[45] Date of Patent: May 4, 1993

[54] STRUCTURE FOR FIXING A SHIELDING WINDOW OF AN ELECTRONIC EQUIPMENT

[75] Inventors: Yuji Hasegawa; Akiyoshi Yamaguchi; Toshiaki Suzuki; Minoru Suzuki, all of Kawasaki, Japan

[73] Assignee: Fujitsu Limited, Kanagawa, Japan

[21] Appl. No.: 902,732

[22] Filed: Jun. 23, 1992

[30] Foreign Application Priority Data

Jun. 28, 1991 [JP] Japan .................. 3-158112

[51] Int. Cl.⁵ .............................................. H05K 9/00
[52] U.S. Cl. .................... 174/35 R; 361/424
[58] Field of Search .......... 174/35 R, 35 MS; 361/424; 219/10.55 R, 10.55 D

[56] References Cited
U.S. PATENT DOCUMENTS

4,381,421  4/1983  Coats et al. ............ 174/35 R
4,701,801  10/1987  Hobbins et al. .......... 174/35 R
5,032,689  7/1991  Halligan et al. ......... 174/35 R Primary Examiner—Leo P. Picard
Assistant Examiner—B. Lee Ledynh
Attorney, Agent, or Firm—Armstrong, Westerman, Hattori, McLeland & Naughton

[57] ABSTRACT

A structure for fixing a shielding window so as to cover an opening formed in a cover of an electronic equipment comprising: a cover having a bonnet and a metallic shielding plate connected to a reverse side of the bonnet, the cover being entirely coated with an insulating layer, the reverse surface of the cover being further coated with a conductive layer; a shielding window with a conductive member embedded therein being mechanically fixed to the cover with an adhesive provided in a plurality of fixing holes formed on the outer peripheral flange surface of the shielding window; and a plurality of holes penetrating through the flange surface of said shielding window, conductive layer, and insulating layer to the shielding plate, and being filled with a conductive adhesive so as to electrically connect the conductive member of the shielding window with the shielding plate.

7 Claims, 7 Drawing Sheets

PRIOR ART

STRUCTURE FOR FIXING A SHIELDING WINDOW OF AN ELECTRONIC EQUIPMENT

BACKGROUND OF THE INVENTION

1. Field of the Invention

The present invention relates to a structure for fixing a shielding window of an electronic equipment.

2. Description of the Related Art

Figure 5:
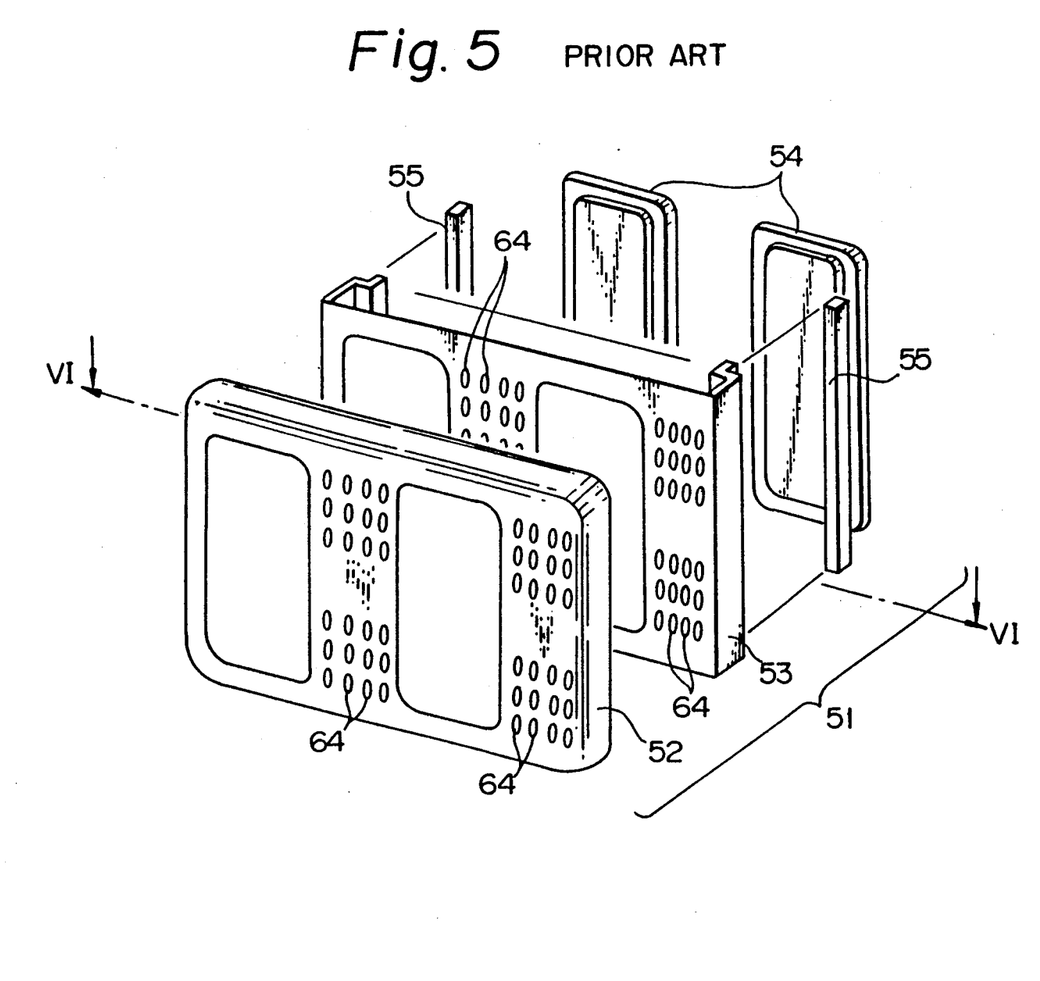
FIG. 5 is an exploded perspective view of a conventional cover.

As shown in FIG. 5, a cover 51 for covering a front of a frame (not shown) in which an electronic equipment, for example, a communication device is accommodated, essentially includes a bonnet 52 made of a conductive plastic, a metallic shielding plate 53 connected to the reverse side of the bonnet 52, and a shielding window 54 made of transparent plastic and adhered to the bonnet 52 (the shielding plate 53) in such a manner that portions of the shielding window 54 are engaged with rectangular holes (in the case shown in FIG. 5, two rectangular holes are provided) which penetrate through the aforementioned members. Further, shielding gaskets are provided between both sides of the cover 51 and the frame (not shown).

Figure 6:
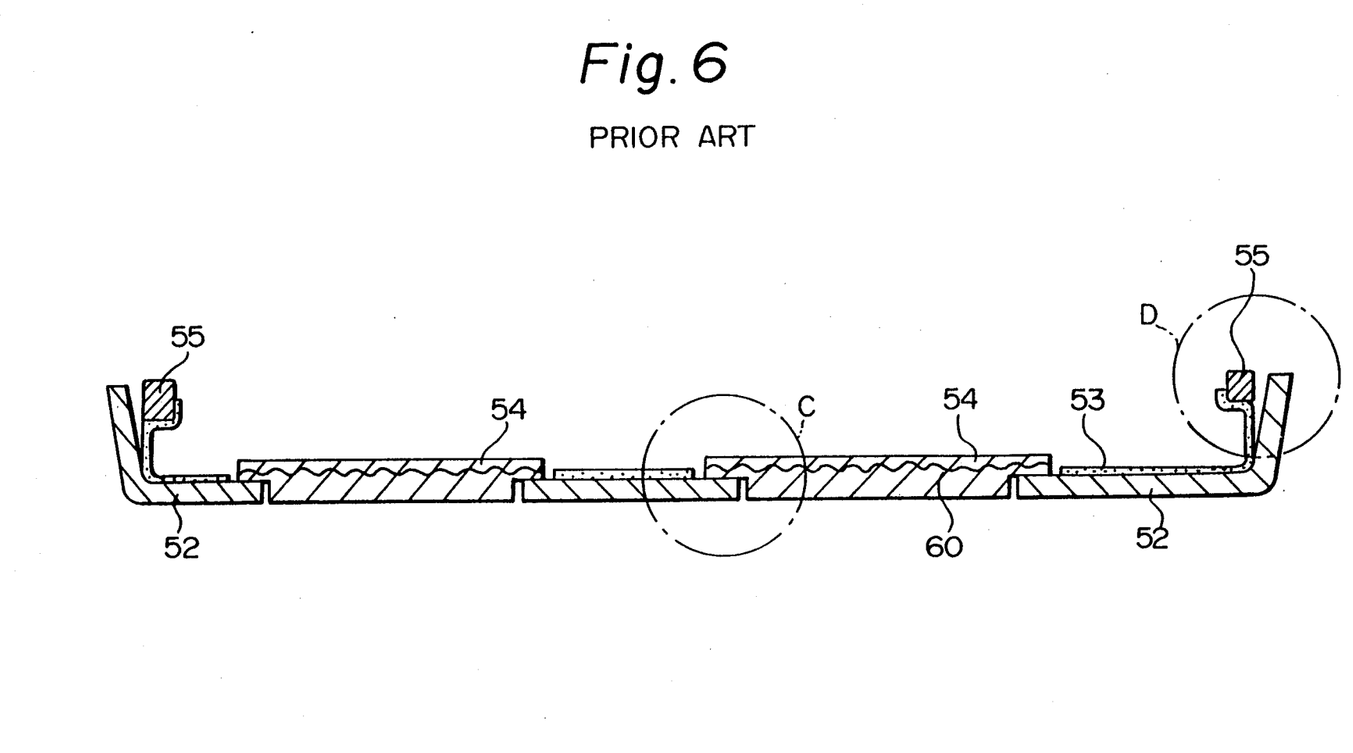
FIG. 6 is a lateral sectional view of the cover taken on line VI—VI in FIG. 5 viewed from the direction of an arrow.
Figure 7:
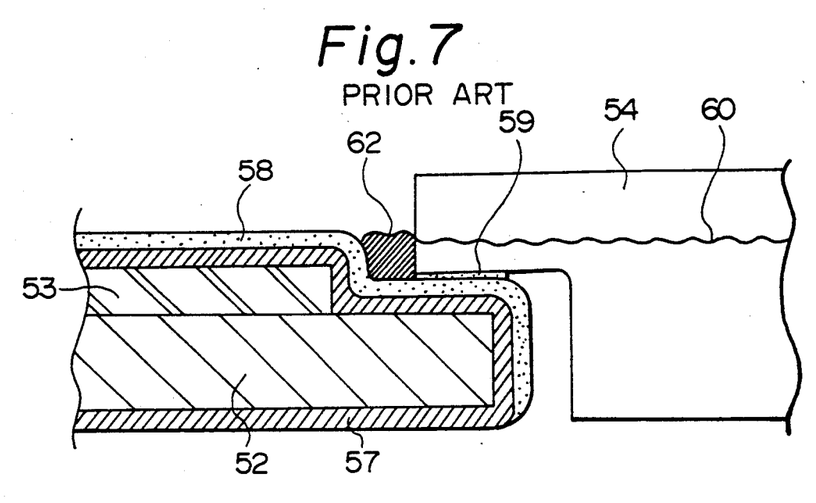
FIG. 7 is an enlarged view of a portion encircled with circle C shown in FIG. 6.

As can be seen from FIG. 7, which is an enlarged sectional view of a portion encircled with a circle C shown in FIG. 6, which is a lateral sectional view of the cover 51, first the surface of the bonnet 52 and that of the shielding plate 53 are entirely coated with an insulating layer (an insulating coated layer) 57, and then the surfaces on the reverse side (the inside) of the bonnet 52 and that of the shielding plate 53 are coated with a carbon coated layer (a conductive layer) 58.

Figure 8:
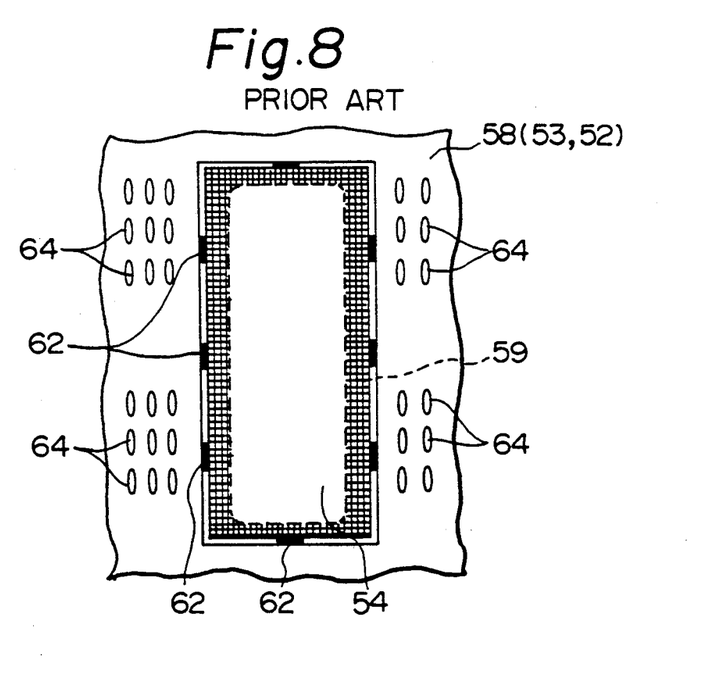
FIG. 8 is a rear side view of a shielding window viewed from the reverse side of a cover; and, FIG. 9 is an enlarged view of a portion encircled with circle D shown in FIG. 6.

The shielding window 54 is adhered to the reverse side of the bonnet 52 by an annular adhesive layer 59 coated on a small outer circumferential portion (a flange portion) on the side of the mount surface of the shielding window 54, as shown in FIG. 8, and a mesh-shaped conductive member 60 is embedded inside the shielding window 54 in parallel with the front surface (or the rear surface) of the shielding window 54, as shown in FIG. 7.

In order to make the electrical potential of the conductive member 60 equal to that of the cover 51, i.e., in order to ground the conductive member 60, after the shielding window 54 has been adhered thereto, a portion of the conductive member 60 that protrudes slightly from the end surface of the shielding window 54 is cross-linked with the carbon coated layer 58 on the reverse side of the bonnet 52 (the shielding plate 53) by an expensive conductive adhesive 62, as shown in FIGS. 7 and 8.

Figure 9:
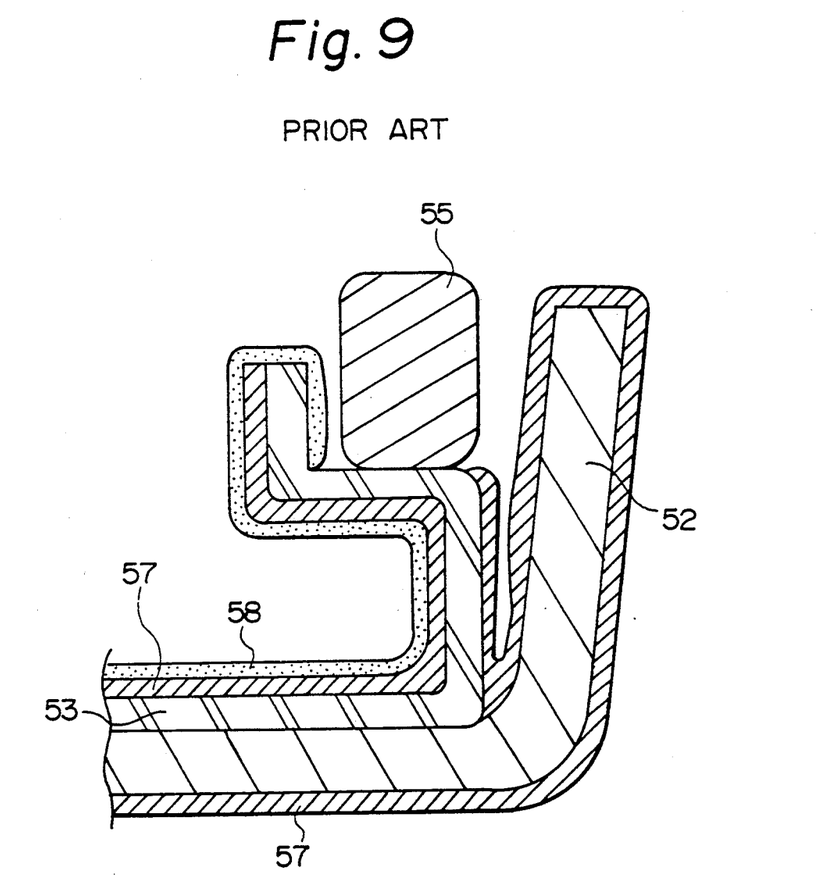

As can be seen from FIG. 9, which is an enlarged view of a portion encircled with a circle D in FIG. 6, a U-shaped groove portion is provided between an edge portion of the shielding plate 53 and folded inside in such a manner that the folded edge portion is separate from the bonnet 52, and a portion of the bonnet 52 is disposed in parallel to the aforementioned edge portion of the shielding plate 53. A long and slender shielding gasket 55, having a rectangular section, is provided in the U-shaped groove portion.

A large number of ventilation holes 64 are formed in predetermined portions of the bonnet 52 and the shielding plate 53.

In the structure mentioned above, the shielding window 54 and the bonnet 52 (the shielding plate 53) are connected by the annular narrow adhesive layer 59, and accordingly, this is disadvantageous in that a sufficient adhesive strength (joint strength) cannot be stably obtained.

When an amount of adhesive used is small, the adhesion strength becomes lower, and when the amount of adhesive used is increased, to improve the adhesion strength, the adhesive is forced out from a gap and the appearance is deteriorated. Therefore, the adhesion procedure is difficult and troublesome.

In the aforementioned conventional structure, the electric resistance from the shielding window 54 to the frame is high.

Namely, electricity is grounded in the following manner: first electricity flows to the carbon coated surface 58 on the reverse side of the cover from the mesh-shaped conductive member 60 of the shielding window 54 through the conductive adhesive 62; the electricity flows on the carbon coated surface 58, having a relatively high electric resistance to one of the edge portions on the side of the cover; and thereafter, the electricity flows to the shielding plate 53 from the carbon coated surface 58 of the cover edge portion, and flows to the frame ground from the shielding plate 53 through the shielding gasket 55.

As described above, the electrical path on the cover surface is relatively long, and further, the carbon coated surface 58, which constitutes the main portion of the electrical path, has a relatively high electrical resistance, and therefore, a sufficient shielding effect cannot be provided.

SUMMARY OF THE INVENTION

The primary object of the present invention, therefore, is to provide a structure for fixing a shielding window that is free from the aforementioned drawbacks, and that enables an easy adhesion process and improves the shielding effect thereof.

To achieve the above object, according to the present invention, there is provided a structure for fixing a shielding window so as to cover an opening formed in a cover of an electronic equipment comprising: a cover having a bonnet and a metallic shielding plate connected to a reverse side of said bonnet, said cover being entirely coated with an insulating layer, the reverse surface of said cover being further coated with a conductive layer; a shielding window with a conductive member embedded therein being mechanically fixed to said cover by an adhesive provided in a plurality of fixing holes formed on the outer peripheral flange surface of said shielding window; and a plurality of holes penetrating through said flange surface of said shielding window, conductive layer, and insulating layer to said shielding plate, and being filled with a conductive adhesive so as to electrically connect said conductive member of said shielding window with said shielding plate.

With this arrangement, the shielding window can be mechanically fixed by the adhesive provided in fixing holes, and therefore, the assembly work is simplified.

A conductive member in the shielding window and the shielding plate are electrically directly connected by the conductive adhesive filled in the holes reaching the shielding plate, and therefore, the entire electrical resistance is lowered and the shielding effect is accordingly improved.

BRIEF DESCRIPTION OF THE DRAWINGS

These and other objects of the present invention will become apparent from the following detailed description of the preferred embodiment of the invention, taken in connection with the accompanying drawings.

In the drawings.

DESCRIPTION OF THE PREFERRED EMBODIMENT

An embodiment of the present invention will be explained as follows with reference to the attached drawings. Like parts in each of the aforementioned conventional structure and the structure of the following embodiment are identified by the same reference character, and explanations common to both are omitted here and only parts peculiar to the embodiment will be explained.

Figure 1:
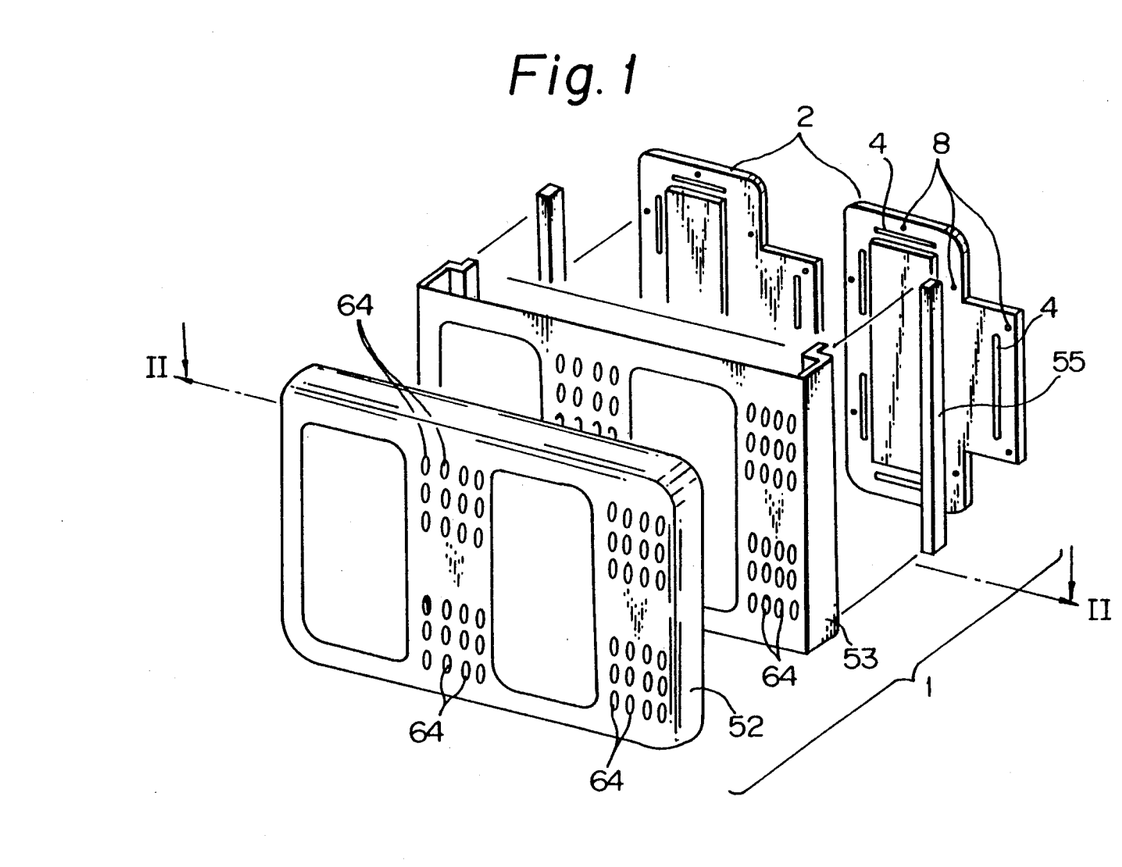
FIG. 1 is an exploded perspective view of a cover of an embodiment provided with the shielding window fixing structure of an electronic equipment according to the present invention.
Figure 2:
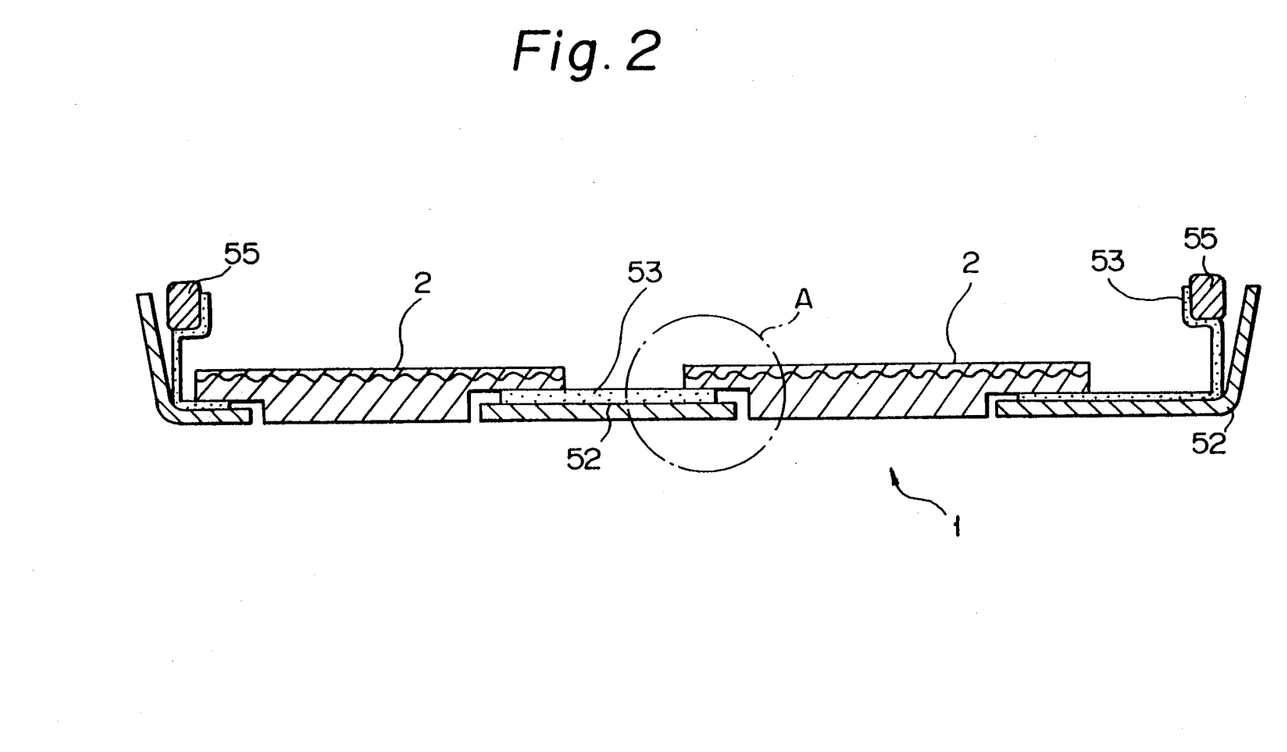
FIG. 2 is a lateral sectional view of the cover taken on line II—II in FIG. 1 viewed from the direction of an arrow.
Figure 3:
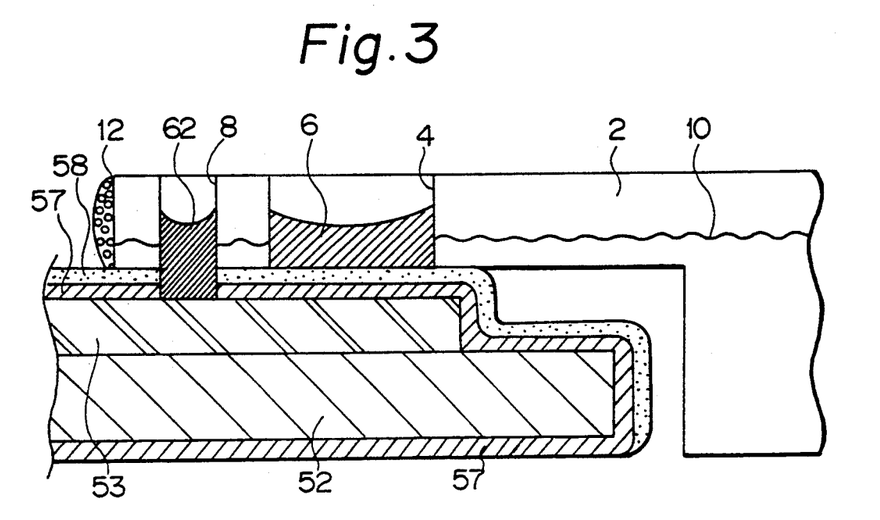
FIG. 3 is an enlarged view of a portion encircled with circle A in FIG. 2.
Figure 4:
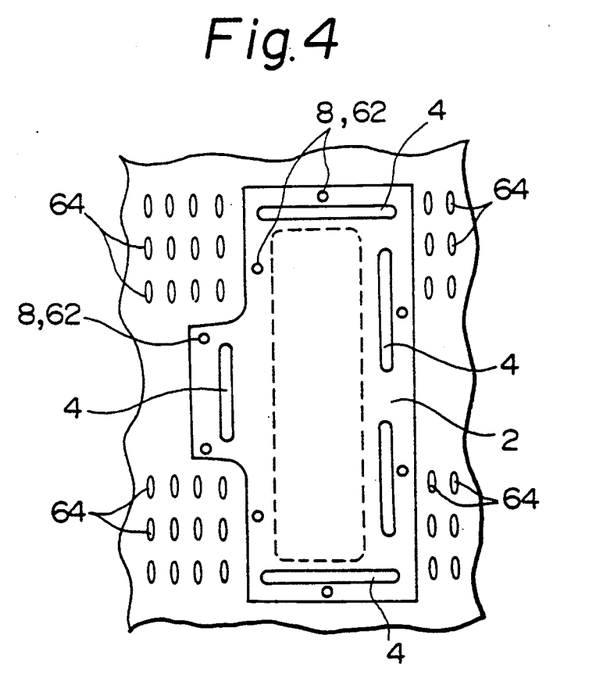
FIG. 4 is a rear side view of a shielding window viewed from the reverse side of a cover.

FIG. 1 is an exploded perspective view of a cover of an embodiment of shielding window fixing structure in an electronic equipment according to the present invention; FIG. 2 is a lateral sectional view of the cover taken on line II—II in FIG. 2; FIG. 3 is an enlarged view of a portion encircled with a circle A in FIG. 2; and FIG. 4 is a rear side view of the shielding window viewed from the rear side of the cover.

With reference to these drawings, the cover 1 of this embodiment essentially includes a bonnet 52 made of a conductive plastic, a metallic shielding plate 53 fixed to the reverse side of the bonnet 52, and a shielding window 2 made of a transparent plastic adhered to the shielding plate 53 in such a manner that a portion of the shielding window 2 is engaged in rectangular holes (two rectangular holes are shown in the drawing) formed in the plastic bonnet 52 and the metallic shielding plate 53 so that the rectangular holes penetrate therethrough. Shielding gaskets 55 are provided between the sides of the cover 1 and the frame (not shown).

The bonnet 52 and the shielding plate 53 joined to each other are coated with the insulating coated layer 57 and the carbon coated layer 58 in the same manner as the aforementioned conventional structure.

The shape of the shielding window 2 and the manner of mounting same, however, are completely different from those of the conventional shielding window.

An outer peripheral mount surface portion (a flange portion) of the shielding window 2 of the embodiment shown in the drawing, is large as a whole, and further, the center portion of one of the side portions is partially protruded in the surface direction.

This flange portion (and the protruded portion) is provided with a plurality of long holes (slotted holes) 4 to be used to fix the shielding window 2. When the shielding window 2 is mounted, adhesive is provided in these long holes to thus fix the shielding window 2. As shown in FIG. 3, the shielding window 2 and the shielding plate 53 (the carbon coated layer 58) are tightly fixed to each other by the adhesive 6. Since the adhesive 6 is less susceptible to a flow out from the long holes 4, it is not necessary to conduct this adhesion work as carefully as in the case of the conventional shielding window. That is, the adhesion work can be easily conducted in a mechanical manner, and thus the workability is improved.

In the conventional structure described above, as shown in FIG. 7, the conductive member 60 in the shielding window 54 and the carbon coated layer 58 on the reverse surface of the cover are connected by the conductive adhesive 62, so that electricity flows for a relatively long distance on the carbon coated layer 58 having a relatively high electric resistance. Therefore, the total electric resistance becomes high, and problems occur from the viewpoint of shielding. Such problems do not occur in this embodiment.

That is, as shown in FIG. 3, a plurality of circular holes 8 are formed, for example, with an electric drill, in such a manner that they penetrate through the flange portion (and the protruded portion) of the shielding window 2, the carbon coated layer 58 and the insulating layer 57, and reach the shielding plate 53. Then, the conductive adhesive 62 is filled in these circular holes 8 to thereby electrically connect the mesh-shaped conductive member 10 in the shielding window 2 with the shielding plate 53 (the carbon coated layer 58).

Therefore, (static) electricity flows to the shielding plate 53 from the conductive member 10 through the conductive adhesive 62, and is grounded through the shielding plate 53, the electrical resistance of which is much smaller than that of the carbon coated layer 58. Accordingly, the electrical resistance is reduced as a whole, and the shielding effects can be improved.

Finally, another characteristic of this embodiment will be briefly described as follows. The entire edge surface of the shielding window 2 is coated with the metallic conductive coated layer 12, and this conductive coated layer 12 is electrically connected to the conductive member 10. When the shielding window 2 is mounted on the cover 1, the conductive coated layer 12 and the carbon coated layer 58 on the reverse side of the cover 1 are in full contact, and are engaged with each other, at the edge portion of the shielding window 2 as shown in the left upper portion of FIG. 3.

In the conventional structure, the conductive member 60 of the shielding window 54 and the carbon coated surface 58 on the reverse side of the bonnet are electrically connected by the conductive adhesive 62 in a point connection, as shown in FIG. 8. Accordingly, the conventional structure is disadvantageous in that electric waves tend to leak outside through the conductive adhesive 62.

In this embodiment, however, such a problem is avoided. That is, the entire circumference of the shielding window 2 (the conductive member 10) can be safely and positively shielded as shown in FIG. 4.

From the foregoing, it can be seen that, according to the present invention a high adhesion strength of the shielding window is maintained, and the workability is improved. Further, the electric resistance of the cover is reduced, and thus the shielding performance is improved.

It is to be understood that the invention is by no means limited to the specific embodiments illustrated and described herein, and that various modifications thereof may be made which come within the scope of the present invention as defined in the appended claims.

We claim:

1. A structure for fixing a shielding window so as to cover an opening formed in a cover of an electronic equipment comprising:
   a cover having a bonnet and a metallic shielding plate connected to a reverse side of said bonnet, said cover being entirely coated with an insulating layer, the reverse surface of said cover being further coated with a conductive layer;
   a shielding window with a conductive member embedded therein being mechanically fixed to said cover with an adhesive provided in a plurality of fixing holes formed on the outer peripheral flange surface of said shielding window; and
   a plurality of holes penetrating through said flange surface of said shielding window, conductive layer, and insulating layer to said shielding plate, and being filled with a conductive adhesive so as to electrically connect said conductive member of said shielding window with said shielding plate.

2. A structure for fixing a shielding window according to claim 1, wherein said bonnet is made of a conductive plastic.

3. A structure for fixing a shielding window according to claim 1, wherein said conductive layer comprises a carbon coated layer.

4. A structure for fixing a shielding window according to claim 1, wherein said opening formed in said cover has a rectangular shape.

5. A structure for fixing a shielding window according to claim 1, wherein said plurality of fixing holes are slotted holes.

6. A structure for fixing a shielding window according to claim 1, wherein said conductive member has a mesh shape and is embedded inside said shielding window in parallel with the surface of said shielding window.

7. A structure for fixing a shielding window according to claim 1, wherein the entire edge surface of said shielding window is coated with a metallic conductive layer such that said conductive member embedded inside said shielding window is electrically connected to said conductive layer of said cover therewith, to thereby shield the entire circumference of the shielding window.

* * * * *